(12) United States Patent
Nguyen et al.

(10) Patent No.: US 7,119,636 B2
(45) Date of Patent: Oct. 10, 2006

(54) MICROMECHANICAL RESONATOR DEVICE HAVING A DESIRED MODE SHAPE

(75) Inventors: Clark T. -C. Nguyen, Arlington, VA (US); Yuan Xie, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 89 days.

(21) Appl. No.: 10/990,785

(22) Filed: Nov. 17, 2004

(65) Prior Publication Data

US 2005/0174197 A1    Aug. 11, 2005

Related U.S. Application Data

(63) Continuation-in-part of application No. 10/737,363, filed on Dec. 16, 2003, now Pat. No. 6,985,051.

(60) Provisional application No. 60/520,954, filed on Nov. 18, 2003.

(51) Int. Cl.
*H03H 9/02* (2006.01)
*H03H 9/46* (2006.01)
*H03H 9/48* (2006.01)

(52) U.S. Cl. ..................... 333/186; 333/199
(58) Field of Classification Search ........ 333/186–192, 333/197–199; 310/309
See application file for complete search history.

(56) References Cited

U.S. PATENT DOCUMENTS 6,985,051 B1 *  1/2006  Nguyen et al. ............. 333/186

OTHER PUBLICATIONS

Wang, Jing, et al., 1.14-Ghz Self-Aligned Vibrating Micromechanical Desk Resonator, Tech. Dig. '03, Radio Frequency Integrated Circuits Symposium, Philadelphia, Pennsylvania, Jun. 8-10, 2003, pp. 947-950.

Clark, J.R., et al., High-Q VHF Micromechanical Contour-Mode Disk Resonators, Technical Digest, IEEE Int. Electron Devices Meeting, San Francisco, CA, Dec. 11-13, 2000, pp. 493-496.

(Continued)

*Primary Examiner*—Barbara Summons
(74) *Attorney, Agent, or Firm*—Brooks Kushman P.C.

(57) ABSTRACT

A micromechanical resonate device having an extensional wine-glass mode shape is described herein. Different embodiments of the device may employ vibrating polysilicon micromechanical ring resonators, utilizing a unique extensional wine-glass mode shape to achieve lower impedance than previous UHF resonators at frequencies as high as 1.2-GHz with a Q of 3,700, and 1.47-GHz (highest to date for polysilicon micromechanical resonators) with a Q of 2,300. The 1.2-GHz resonator exhibits a measured motional resistance of 560 kΩ with a dc-bias voltage of 20V, which is 6× lower than measured on radial contour mode disk counterparts at the same frequency, and which can be driven down as low as 2 kΩ when a dc-bias voltage of 100V and electrode-to-resonator gap spacing of 460 Å are used. The above high Q and low impedance advantages, together with the multiple frequency, on-chip integration advantages afforded by electrostatically-transduced μmechanical resonators, may be utilized in the front-end RF filtering and oscillator functions needed by wireless communication devices.

1 Claim, 5 Drawing Sheets

OTHER PUBLICATIONS

Abdelmoneum, Mohamed A., et al., Stemless Wine-Glass-Mode Disk Micromechanical Resonators, Proceedings, 16th Int. IEEE Micro Electro Mechanical Systems Conf., Kyoto, Japan, Jan. 19-23, 2003, pp. 698-701.

Bircumshaw, Brian, et al., The Radial Bulk Annular Resonator: Towards A 50Ω RF MEMS Filter, Transducers '03, pp. 875-878.

Ambati, G., et al., In-Plane Vibrations of Annular Rings, Journal of Sound and Vibration, vol. 47, No. 3, Chapter 3, 1976, pp. 415-432.

Johnson, R.A., Mechanical Filters in Electronics, Chapter 3, Resonators and Coupling Elements, pp. 66-129, New York, NY: Wiley, 1983.

Bannon, F.D., et al., High-Q HF Microelectromechanical Filters, IEEE J. Solid-State Circuits, vol. 35, No. 4, Apr. 2000, pp. 512-526.

\* cited by examiner

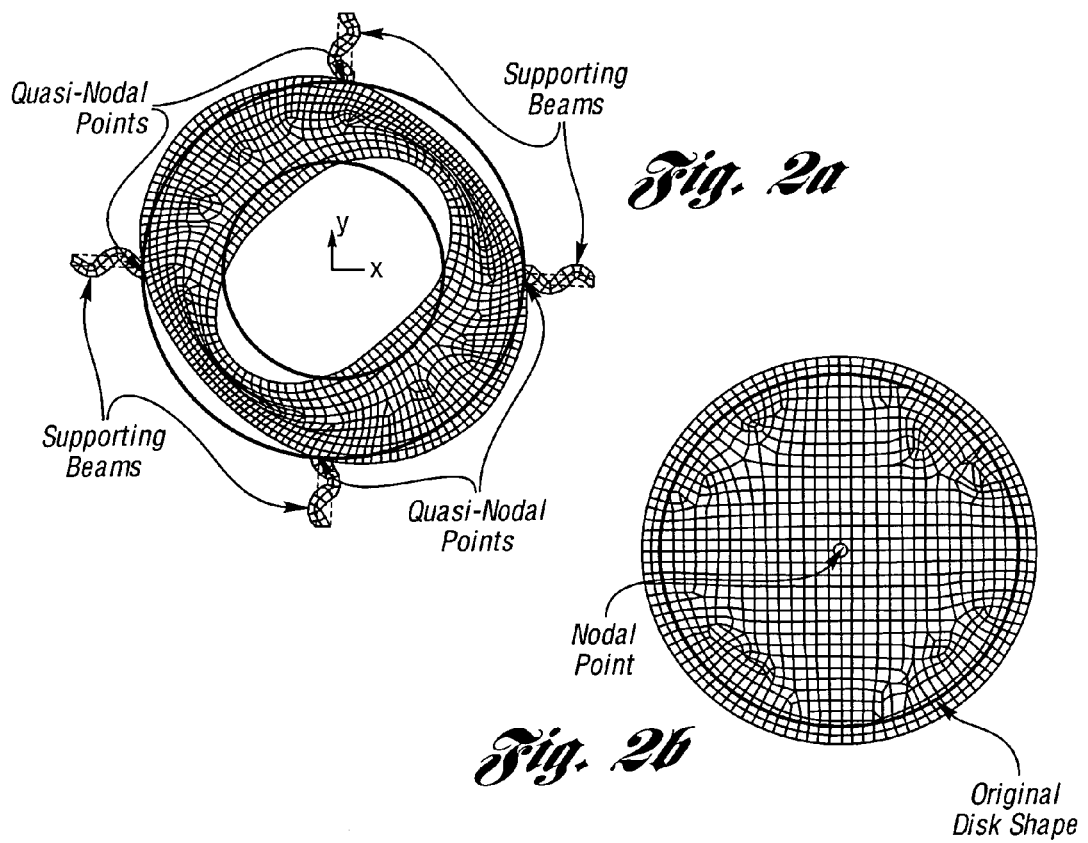
Fig. 2a
Fig. 2b
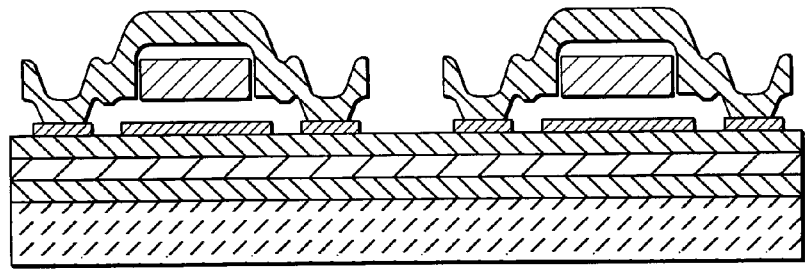
Fig. 3a
Fig. 3b

$R_{in} = 32.6 \mu m$
$R_{out} = 42.3 \mu m$ $R_{in} = 21.7 \mu m$
$R_{out} = 28.2 \mu m$

MICROMECHANICAL RESONATOR DEVICE HAVING A DESIRED MODE SHAPE

CROSS-REFERENCE TO RELATED APPLICATIONS

This application claims the benefit of U.S. provisional application Ser. No. 60/520,954, filed Nov. 18, 2003 and entitled "Extensional Wine Glass Resonator." This application is a continuation-in-part of U.S. application Ser. No. 10/737,363 now U.S. Pat. No. 6,985,051, filed Dec. 16, 2003 and entitled "Micromechanical Resonator Device and Method of Making a Micromechanical Device.

STATEMENT REGARDING FEDERALLY SPONSORED RESEARCH OR DEVELOPMENT

The invention was made with Government support under DARPA Grant No. F30602-01-1-0573. The Government has certain rights to the invention.

BACKGROUND OF THE INVENTION

1. Field of the Invention

This invention relates to micromechanical resonator devices having desired mode shapes.

2. Background Art

The following references are referenced herein:

1. J. Wang, Z. Ren, and C. T.-C. Nguyen, "Self-Aligned 1.14 GHz vibrating radial-mode disk resonators," TRANSDUCERS '03, pp. 947–950.
2. J. R. Clark, W.-T. Hsu, and C. T.-C. Nguyen, "High-Q VF μmechanical contour-mode disk resonators," IEDM '00, pp. 399–402.
3. M. A. Abdelmoneum, M. U. Demirci, and C. T.-C. Nguyen, "Stemless wine-glass-mode disk μmech. resonators," MEMS '03, pp. 698–701.
4. B. Bircumshaw, G. Liu, H. Takeuchi, T.-J. King, R. Howe, O. O'Reilly, A. Pisano, "The radial bulk annular resonator: towards a 50Ω RF MEMS filter, TRANSDUCERS '03, pp. 875–879.
5. G. Ambati, J. F. W. Bell, and J. C. K. Sharp, "In-plane vibrations of annular rings," JOURNAL OF SOUND AND VIBRATION, Vol. 47, no. 3, pp. 415–432, 1976.
6. R. A. Johnson, "Mechanical Filters in Electronics," New York, N.Y.; Wiley, 1983.
7. F. D. Bannon III, J. R. Clark, C. T.-C. Nguyen, "High-Q HF microelectromechanical Filters, IEEE J. SOLID-STATE CIRCUITS, Vol. 35, no. 4, pp. 512–526, April 2000

Having recently been demonstrated at frequencies past 1 GHz with Q's>1,500 in both vacuum and air [1], vibrating micromechanical ("μmechanical") resonators are emerging as possible enablers for on-chip versions of the pre-select (or even channel-select) filters needed in the RF front-ends of wireless communication devices. The availability of such on-chip RF filters could greatly simplify the realization of future multi-band reconfigurable wireless communicators, which are expected to require many more RF filters than today's communicators—e.g., one set for each supported communication standard. Unfortunately, however, although their Q's and frequencies are now sufficient, the impedances of the GHz range μmechanical resonators demonstrated so far are still too high to allow direct coupling to antennas in RF systems, where matching to impedances in the range of 50Ω and 330Ω is often required.

SUMMARY OF THE INVENTION

An object of the present invention is to provide a micromechanical resonator device having a desired mode shape and capable of achieving higher frequency and lower impedance than previous UHF micromechanical resonators.

In carrying out the above object and other objects of the present invention, a micromechanical resonator device having a desired mode shape is provided. The device includes a substrate and a resonator having inner and outer peripheries. The desired mode shape is characterized by a plurality of quasi-nodal points located about the peripheries. Portions of the resonator exhibit extensional characteristics. The peripheries exhibit both radial and tangential displacements at resonance. The device also includes a non-intrusive support structure anchored to the substrate to support the resonator above the substrate and attached to the resonator at at least one of the quasi-nodal points to reduce mechanical losses to the substrate.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1b is a schematic view of a 2-port circuit equivalent to the device of FIG. 1a;

FIG. 2a is an ANSYS-simulation resonance mode shape for the device of FIG. 1a;

FIG. 2b is an ANSYS-simulation resonance mode shape for a radial-contour mode solid-disk resonator of the prior art;

FIG. 3a is a sectional view taken along lines A—A in FIG. 1a and showing overhanging polysilicon electrodes;

FIG. 3b is a sectional view taken along lines B—B in FIG. 1a and showing side supports after release;

FIG. 4b is an enlarged SEM of a portion of the SEM of FIG. 4a;

FIG. 5a is a graph of power versus frequency for the device of FIG. 4a;

DETAILED DESCRIPTION OF THE PREFERRED EMBODIMENT(S)

Figure 1A:
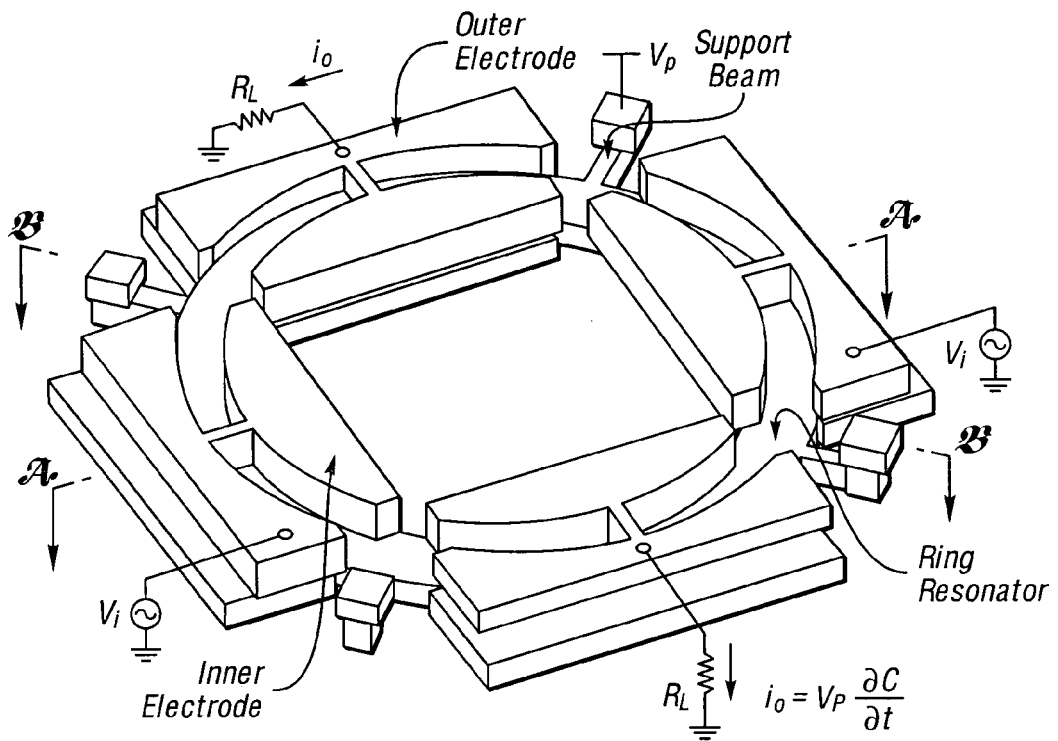
FIG. 1a is a perspective schematic view of a resonator device constructed in accordance with an embodiment of the present invention and having a typical drive and sense electrode configuration.
Figure 1B:
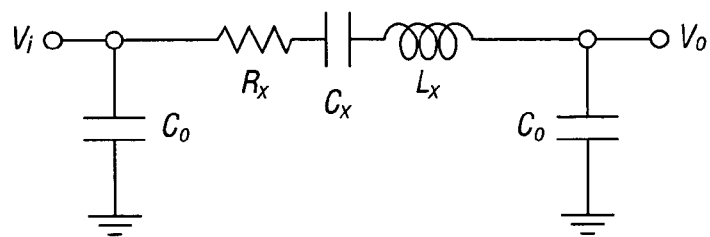

One embodiment of the present invention provides a micromechanical resonator device having an extensional wine-glass mode shape. This resonator operates in a special resonant mode, with a shape shown in FIG. 2a, that combines aspects of two previously demonstrated modes, namely, the extensional radial contour vibration mode [1][2] and the wine-glass disk vibration mode [3], together with the geometric advantages of a ring structure [4], to achieve the best of each design. In particular, this extensional wine-glass resonator design allows: (1) a high resonance frequency, owing to its use of an extensional mode; (2) a low motional impedance, due to its ring-geometry, which offers a larger capacitive transducer overlap area than provided by the perimeter of a filled disk; and (3) higher Q, since its mode shape resembles a wine-glass-like mode [3], which allows its support structure to avoid a centrally located stem and thereby reduce anchor losses. With this design, frequencies as high as 1.2-GHz with Q's around 3,700, and 1.47-GHz with a Q of 2,300, have been demonstrated, with motional resistances 6× lower than measured on radial contour mode disk counterparts.

Device Structure and Operation

The dimensions needed to attain a specified resonance frequency $f_o$ for an extensional wine-glass mode ring resonator can be obtained by solving the mode frequency equation [5]:

$$f_o = \frac{\alpha}{2\pi R_{out}} \sqrt{\frac{E}{p(1-\sigma^2)}} \quad (1)$$

where p, σ, and E are the density, Poisson ratio, and Young's modulus, respectively, of the ring structural material, and α is a parameter that depends upon the inner and outer ring radii, $R_{in}$ and $R_{out}$, respectively, and on a matrix that specifies the mode shape. For $R_{in}$=11.8 µm and $R_{out}$=22.2 µm, α-20.35 for the extensional wine-glass mode shape.

As with other vibrating resonators, the equivalent LCR circuit for the extensional wine-glass ring is governed by the total integrated kinetic energy in the resonator, by its mode shape, and by parameters associated with its transducer ports [6]. Using the procedure of [7], an approximate expression for the equivalent series motional resistance, $R_x$, of an extensional wine-glass ring resonator can be obtained. For an electrode configuration as in FIG. 4a, with ports 1 and 2 used for input, and 3 and 4 for output, the Rx expression can be written as:

$$R_x = \frac{\omega_o m_{re}}{Q V_P^2} \cdot \frac{d_o^4}{\varepsilon_o^2 P_{oe}^2 t^2} \quad (2)$$

where $P_{oe}=\pi R_{out}$ and $m_{re}$ is the equivalent mass of the resonator at a location opposite an electrode center, given by:

$$m_{re} = \frac{pt \int_{R_{in}}^{R_{out}} \int_0^{2\pi} [U(r,\theta)]^2 r\, dr\, d\theta}{[U(r,\theta)]^2 \mid r=R_{out}, \theta=0}$$

where $\omega_o$ is its radian resonance frequency, and U(r,θ) is the mode shape. From (2), the best strategies for reducing $R_x$ (in order of effectiveness) are to decrease the electrode-to-resonator gap spacing $d_o$, increase the electrode overlap perimeter $P_{oe}$, increase the device thickness t, and increase the dc-bias voltage $V_p$. Table 1 uses the 1.2-GHz design of this work to illustrate the effect that each of these parameters can have on the $R_x$ of a given resonator design, and in the process, show just how small $R_x$ can become with the right design. The table uses bold-faced print to indicate the variable/value that was altered to achieve an $R_x$ of 2 kΩ, which is small enough to allow on-chip L-network matching to an antenna. As shown in the last column, devices with 2 kΩ impedance should be achievable with reasonably achievable geometric dimensions.

TABLE 1

| Parameter | Ext. WG Resonator Design Possibilities $f_o$ = 1.2 GHz, Q = 5,000 | | | | |
|---|---|---|---|---|---|
| $d_o$[nm] | 85 | 22 | 85 | 85 | 50 |
| t[µm] | 2 | 2 | 10 | 2 | 6 |
| $R_{in}$[µm] | 11.8 | 11.8 | 439.6 | 11.8 | 94.6 |
| $R_{out}$[µm] | 22.2 | 22.2 | 450 | 22.2 | 105 |
| $P_{oe}$[µm] | 70 | 70 | 1410 | 70 | 330 |
| $V_P$[V] | 20 | 20 | 20 | 300 | 20 |
| $R_X$[kΩ] | 435 | 2 | 2 | 2 | 2 |

Due to its use of an extensional mode, the frequency of an extensional wine-glass resonator is determined primarily by the width of its ring, and not by its radius. Thus, the perimeter of the device can be made arbitrarily large to maximize its transducer capacitance, hence, drive down its series motional resistance $R_x$. In addition, since the frequency of this device is determined primarily by its lateral dimensions, which are set by CAD layout, this device easily supports multiple frequencies on a single chip without the need for multiple film depositions. In contrast, counterparts with frequencies determined only by thickness (e.g., FBARs) require an additional film deposition for each additional frequency.

Experimental Results

Figure 4A:
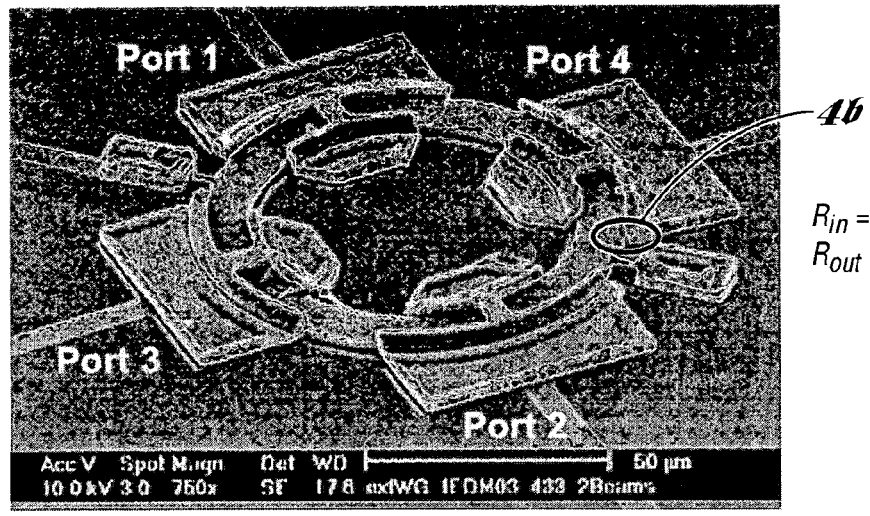
FIG. 4a is a SEM of a device fabricated in accordance with an embodiment of the present invention.
Figure 4B:
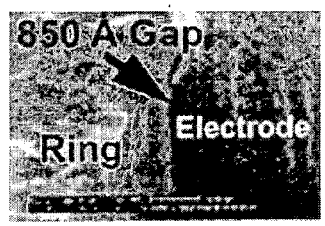
Figure 4C:
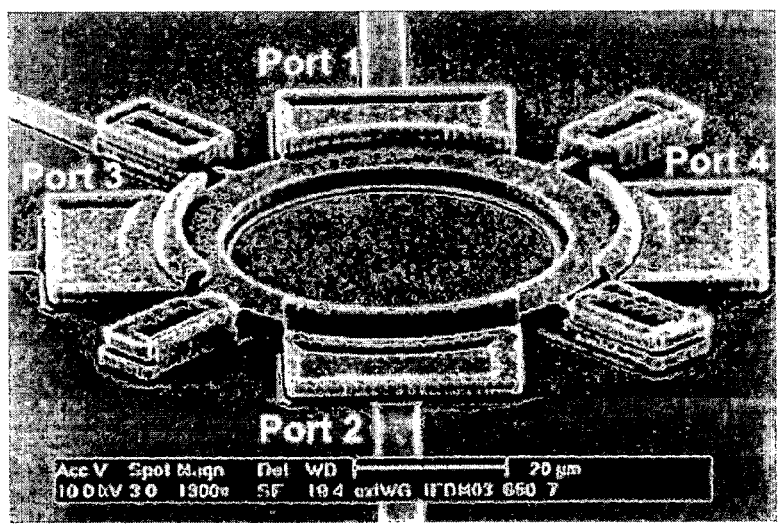
FIG. 4c is a SEM of a device fabricated in accordance with another embodiment of the present invention.

Extensional wine-glass resonators with frequencies ranging from 400 MHZ to 1.5 GHz were designed and fabricated using a process that combines polysilicon surface-micromachining with a sacrificial sidewall spacer technique to achieve POCl$_3$-doped polysilicon structures with polysilicon side electrodes, and with nano-scale electrode-to-resonator lateral gaps [1]. FIGS. 3a and 3b present device cross-sections for an extensional wine-glass ring achieved via this process, taken through the lines indicated in FIG. 1a. FIGS. 4a and 4c present SEM's (and dimensions) for 426-MHZ and 651-MHZ extensional wine-glass rings, respectively, as well as a zoom-in-shot (i.e. FIG. 4b) clearly showing the 85 nm lateral electrode-to-resonator gap achieved via the fabrication process.

The devices of FIGS. 4(a) and (c) were tested under controlled pressures using a custom-built chamber with an electrical hook-up similar to FIG. 1a, but using an RF input signal and local oscillator bias to suppress parasitic components via mixing [1]. No effort was made to impedance match devices to the measuring spectrum analyzer. This helped to preserve true Q values, but at the cost measurement mismatch loss.

Figure 5A:
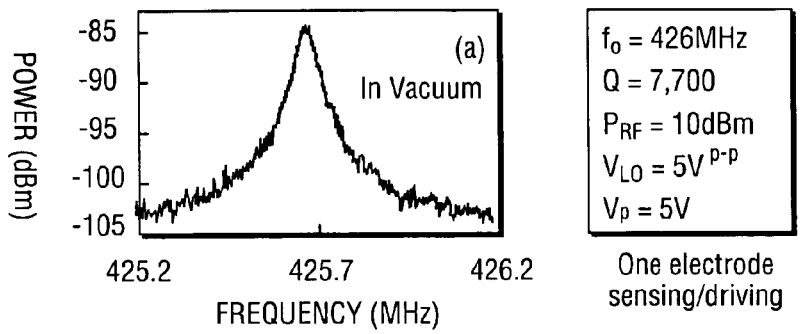
Figure 5B:
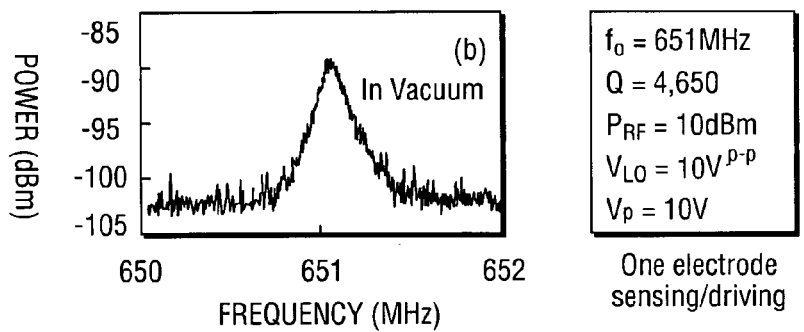
FIGS. 5b, 5c, and 5d are graphs of power versus frequency for the device of FIG. 4b.
Figure 5C:
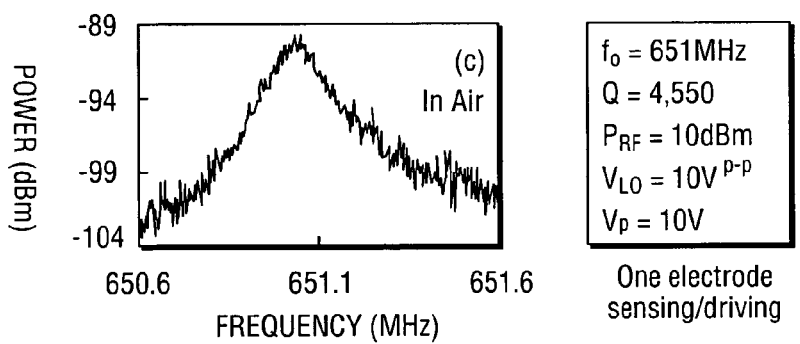
Figure 5D:
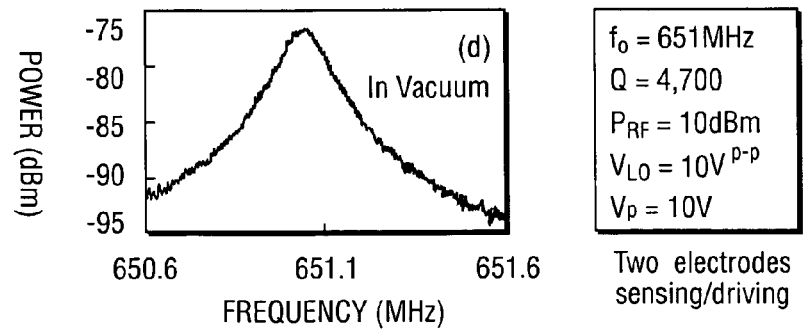

At first, only one set of electrode quarters (i.e., drive port 1, sense from port 3) were used. FIG. 5(a) presents the frequency characteristic for the 426-MHZ devices of FIG. 4a measured under 200 μTorr vacuum, showing a Q of 7,700. FIGS. 5(b) and (c) present measured spectra for the 651-MHZ resonator of FIG. 4c, showing very similar Q's of 4,650 and 4,550 in vacuum and air, respectively, further demonstrating over the work of [1] that high stiffness, high frequency micromechanical resonators do not require vacuum to attain high Q. FIG. 5d presents the frequency spectrum of the 651-MHZ device, measured under vacuum, but this time using more electrodes: specifically, driving ports 1 and 2 and sensing via ports 3 and 4. Here, the additional ports provide a larger output, increasing the transmission power by more than 10 dB, and providing a smoother, noise-free spectrum.

The motional resistance extracted from the data of FIG. 5d is ~280 kΩ, which is substantially lower than the 4 MΩ previously measured for a 733-MHZ disk resonator with a radius of 10 μm [1], proving the $R_x$-lowering ability of this design. If charge is placed on the ring structure to attain an effective dc-bias $V_p$ of 100V, and the electrode-to-resonator gap spacing reduced to 780 Å, (2) predicts an $R_x$ of 2 kΩ, which is in a range where an impedance match to an antenna can be achieved with an on-chip L-network.

Figure 6:
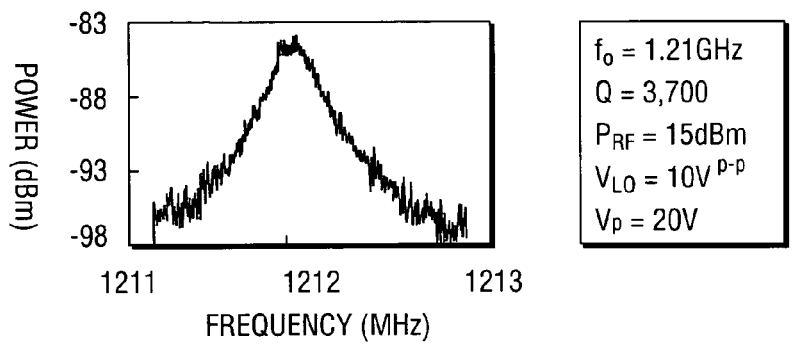
FIG. 6 is a graph of power versus frequency for a 1.21-GHz, 4th-mode device constructed in accordance with the present invention.

By using higher extensional wine-glass modes, GHz frequencies can be achieved. FIG. 6 presents the frequency characteristic for a 1.2-GHz, 4th-mode, extensional wine-glass resonator measured in vacuum. The motional resistance extracted from the data of FIG. 6 is 560 kΩ, which is 6× lower than the 3.5 MΩ previously measured for 1.14-GHz disk resonator with a radius of 10 μm [1], again showing the $R_x$-lowering ability of this design.

Figure 7:
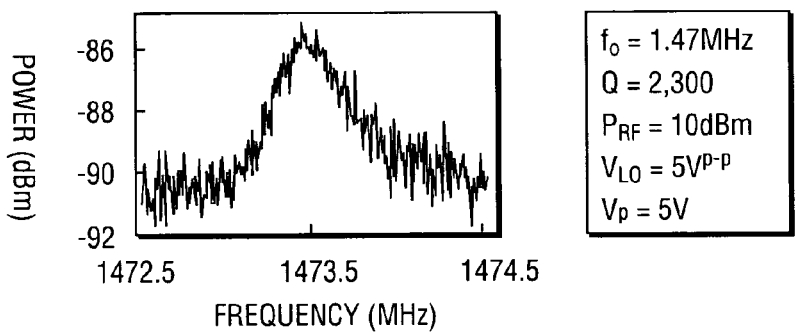
FIG. 7 is a graph of power versus frequency for a 1.47-GHz, 4th-mode device constructed in accordance with the present invention.

FIG. 7 presents the measured spectrum for a 1.47-GHz, 4th-mode extensional wine-glass ring resonator in vacuum with a Q of 2,300. This represents the highest frequency to date measured for polysilicon resonator devices. Table 2 summarizes each of the measured designs.

TABLE 2

| Parameter | Designed Frequency | | | |
| --- | --- | --- | --- | --- |
| | 425.3 MHz | 634.6 MHz | 1210 MHz | 1500 MHz |
| $R_{in}$ [μm] | 32.6 | 21.7 | 11.8 | 33.7 |
| $R_{out}$ [μm] | 42.3 | 28.2 | 22.2 | 42 |
| Thickness [μm] | 2 | 2 | 2 | 2 |
| Simu. $f_o$ [MHZ] | 426.8 | 638.9 | 1220 | 1528 |
| Meas. $f_o$ [MHZ] | 425.7 | 651.0 | 1212 | 1473 |

TABLE 2-continued

| Parameter | Designed Frequency | | | |
| --- | --- | --- | --- | --- |
| | 425.3 MHz | 634.6 MHz | 1210 MHz | 1500 MHz |
| $R_x$@$V_P$ = 10 V | 176 kΩ | 280 kΩ | 2.2 MΩ | 200 kΩ |
| $R_x$@$V_P$ = 100 V | 1.76 kΩ | 2.8 kΩ | 22 kΩ | 2 kΩ |

E = 150 GPa,
p = 2300 kg/m³,
v = 0.226,
$d_o$ = 85 nm

Figure 8:
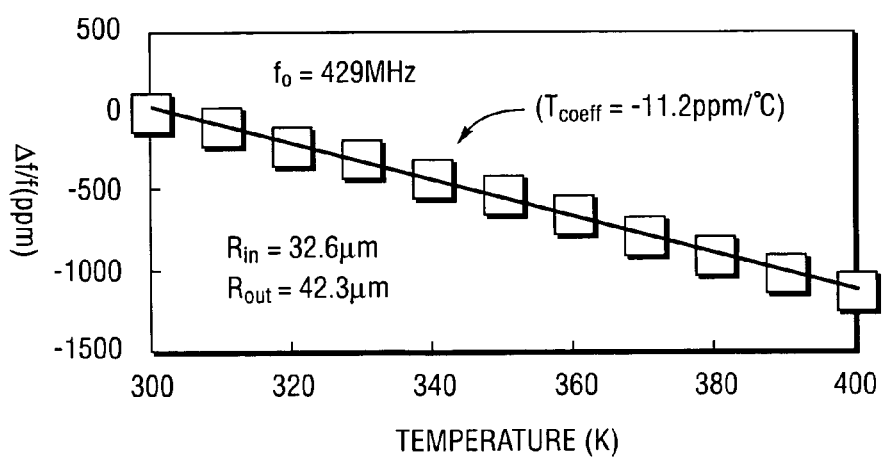
FIG. 8 is a graph of measured fractional frequency change versus temperature for a 2nd mode, 429-MHZ extensional wide-glass ring resonator constructed in accordance with the present invention.

Finally, FIG. 8 presents a measured plot of fractional frequency change versus temperature for a 429-MHZ extensional wine-glass resonator operated in its 2nd extensional mode. The uncompensated temperature coefficient of −11.2 ppm/° C. is somewhat better than exhibited by previous polysilicon resonator designs [1][7]—yet another advantage of this design.

Extensional wine-glass mode ring resonators with frequencies as high as 1.47-GHz, Q's>2,000, and impedances amenable to image-reject filtering and oscillator applications are described herein and should now put to rest any lingering doubts that micromechanical resonator technology can satisfy the RF frequency range needed by today's wireless communications. Design paths based on the extensional wine-glass ring structure have been identified that should enable antenna-amenable impedances. In particular, substantially lower impedance is expected for designs that reduce electrode-to-resonator gap spacing, increase the structural film thickness, and increase the average ring radius, relative to those of the resonators demonstrated here.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A micromechanical resonator device having a desired mode shape, the device comprising:
   a substrate;
   a resonator having inner and outer peripheries wherein the desired mode shape is characterized by a plurality of quasi-nodal points located about the peripheries, wherein portions of the resonator exhibit extensional characteristics and wherein the peripheries exhibit both radial and tangential displacements at resonance; and
   a non-intrusive support structure anchored to the substrate to support the resonator above the substrate and attached to the resonator at at least one of the quasi-nodal points to reduce mechanical losses to the substrate.